US012268100B2

(12) United States Patent
Berggren et al.

(10) Patent No.: US 12,268,100 B2
(45) Date of Patent: Apr. 1, 2025

(54) HIGH TEMPERATURE SUPERCONDUCTOR BI-SUPERCONDUCTING QUANTUM INTERFERENCE DEVICE

(71) Applicant: United States of America as represented by the Secretary of the Navy, San Diego, CA (US)

(72) Inventors: Susan Anne Elizabeth Berggren, San Diego, CA (US); Benjamin Jeremy Taylor, Escondido, CA (US); Nicholas Biagio Ferrante, Lakeside, CA (US); Rachel Mae Hobbs, San Diego, CA (US)

(73) Assignee: United States of America as represented by the Secretary of the Navy, Washington, DC (US)

( * ) Notice: Subject to any disclaimer, the term of this patent is extended or adjusted under 35 U.S.C. 154(b) by 414 days.

(21) Appl. No.: 17/833,093

(22) Filed: Jun. 6, 2022

(65) Prior Publication Data

US 2023/0397507 A1    Dec. 7, 2023

(51) Int. Cl.
*H01L 39/22*    (2006.01)
*H10N 60/12*    (2023.01)
*H10N 60/80*    (2023.01)
*H10N 69/00*    (2023.01)

(52) U.S. Cl.
CPC ........... *H10N 60/12* (2023.02); *H10N 60/805* (2023.02); *H10N 69/00* (2023.02)

(58) Field of Classification Search
CPC ................ H10N 60/805; H10N 69/00; H10N 60/12–126; H10N 60/0912–0941; H10N 60/00; G01R 33/0094; G01R 33/0354; H01L 23/552–556
See application file for complete search history.

(56) References Cited

U.S. PATENT DOCUMENTS

| 5,844,407 | A | * | 12/1998 | Hubbell | ............. | G01R 33/0354 |
| | | | | | | 505/855 |
| 8,933,695 | B1 | | 1/2015 | Kornev | | |
| 9,097,751 | B1 | * | 8/2015 | Longhini | ........... | G01R 33/0354 |
| 2021/0066570 | A1 | * | 3/2021 | Luethi | .................. | H10N 60/805 |

OTHER PUBLICATIONS

Victor K. Kornev et al.; High Inductance Bi-Squid; IEEE/CSC & ESAS Superconductivity News Forum; Jan. 2017.

* cited by examiner

*Primary Examiner* — Shahed Ahmed
(74) *Attorney, Agent, or Firm* — Naval Information Warfare Center Pacific; Kyle Eppele; J. Eric Anderson

(57) ABSTRACT

A superconducting quantum interference apparatus comprising a planar array of loops where each loop constitutes a superconducting quantum interference device, and a magnetic shield disposed over part of one of the loops so to protect the covered part of the loop from exposure to a magnetic field.

20 Claims, 5 Drawing Sheets

*Fig. 3C*  *Fig. 3D*

HIGH TEMPERATURE SUPERCONDUCTOR BI-SUPERCONDUCTING QUANTUM INTERFERENCE DEVICE

FEDERALLY-SPONSORED RESEARCH AND DEVELOPMENT

The United States Government has ownership rights in this invention. Licensing and technical inquiries may be directed to the Office of Research and Technical Applications, Naval Information Warfare Center Pacific, Code 72120, San Diego, CA, 92152; voice (619) 553-5118; ssc_pac_t2@navy.mil. Reference Navy Case Number 111815.

BACKGROUND OF THE INVENTION

Superconducting Quantum Interference Devices (SQUIDs) can comprise tiny loops of superconducting material in which Josephson junctions are placed in the loop path. A Josephson junction can be a region of material that provides a weak link between two fully super-conducting regions. Superconducting electrons can quantum mechanically tunnel across the Josephson junction in a well-understood process.

The direct current (DC) SQUID can have two symmetrical Josephson junctions, and DC SQUIDs can typically sense extremely small magnetic fields. Non-uniforms arrays of DC SQUIDs and DC bi-SQUIDs, which are DC SQUIDs with an additional Josephson Junction bisecting the superconducting loop, have been modeled in different array designs and coupling schemes in the prior art, to determine their linearity and sensing capacities and have been fabricated in low temperature superconducting materials. A SQUID-based sensor can detect minute magnetic fields and can be decoupled from the size of the signal wavelength. As a result, the sensors can sense signals over a wide range of frequencies, from the DC to 100's of Gigahertz (GHz) range, but still be contained fully on a 1×1 cm chip.

SQUID arrays have been explored for radio frequency (RF) detection purposes. SQUID and bi-SQUID arrays that are designed for RF detection throughout the high frequency (HF) to Ultra-High Frequency (UHF) range have been fabricated in low temperature superconductor (LTS) region of operation using Niobium (Nb) substrate material. There is a need for an improved SQUID array with reduced size, weight and power (SWaP) and that can operate at higher temperatures (e.g., in the high temperature superconducting (HTS) range) than the LTS Nb SQUID arrays.

SUMMARY

Disclosed herein is a SQUID array comprising: a planar array of loops and a magnetic shield. Each loop constitutes a SQUID. The magnetic shield is disposed over part of one of the loops to protect the part of the loop from exposure to a magnetic field.

Also disclosed herein is a magnetic field detector that comprises a bi-SQUID and a magnetic shield. The bi-SQUID comprises two Josephson junctions in a superconducting loop and a third Josephson junction in a superconducting path that bisects the superconducting loop. The two Josephson junctions are part of a DC sub-loop and the third Josephson junction is a component of an RF sub-loop. The bi-SQUID is fabricated in a single-layer process such that the bi-SQUID is able to operate, for example, at temperatures above 70 K. The magnetic shield is disposed over one of the sub-loops such that only the sub-loop that is not covered by the magnetic shield is exposed to a magnetic field.

Also disclosed herein is a method of manufacturing an HTS bi-SQUID that comprises the following steps. The first step involves providing a first substrate. Another step provides for forming a superconducting loop with two Josephson junctions on the first substrate. Another step provides for bisecting the superconducting loop with a superconductive bisecting path that includes a third Josephson junction to create a bi-SQUID. The two Josephson junctions form part of a DC sub-loop and the third Josephson junction forms part of a radio frequency (RF) sub-loop. Another step involves providing a second substrate and depositing, on a top surface of the second substrate, enough superconducting material to cover one of the sub-loops. Another step provides for combining the first and second substrates such that their top coatings are touching and the superconducting material is aligned to cover one of the sub-loops such that the superconducting material functions as a magnetic shield configured to shield the covered sub-loop from exposure to a magnetic field.

BRIEF DESCRIPTION OF THE DRAWINGS

Throughout the several views, like elements are referenced using like references. The elements in the figures are not drawn to scale and some dimensions are exaggerated for clarity.

FIGS. 3A-3E are top-view illustrations of different embodiments of a magnetic field detector.

DETAILED DESCRIPTION OF EMBODIMENTS

The disclosed SQUID arrays and methods below may be described generally, as well as in terms of specific examples and/or specific embodiments. For instances where references are made to detailed examples and/or embodiments, it should be appreciated that any of the underlying principles described are not to be limited to a single embodiment, but may be expanded for use with any of the other methods and arrays described herein as will be understood by one of ordinary skill in the art unless otherwise stated specifically.

Figure 1A:
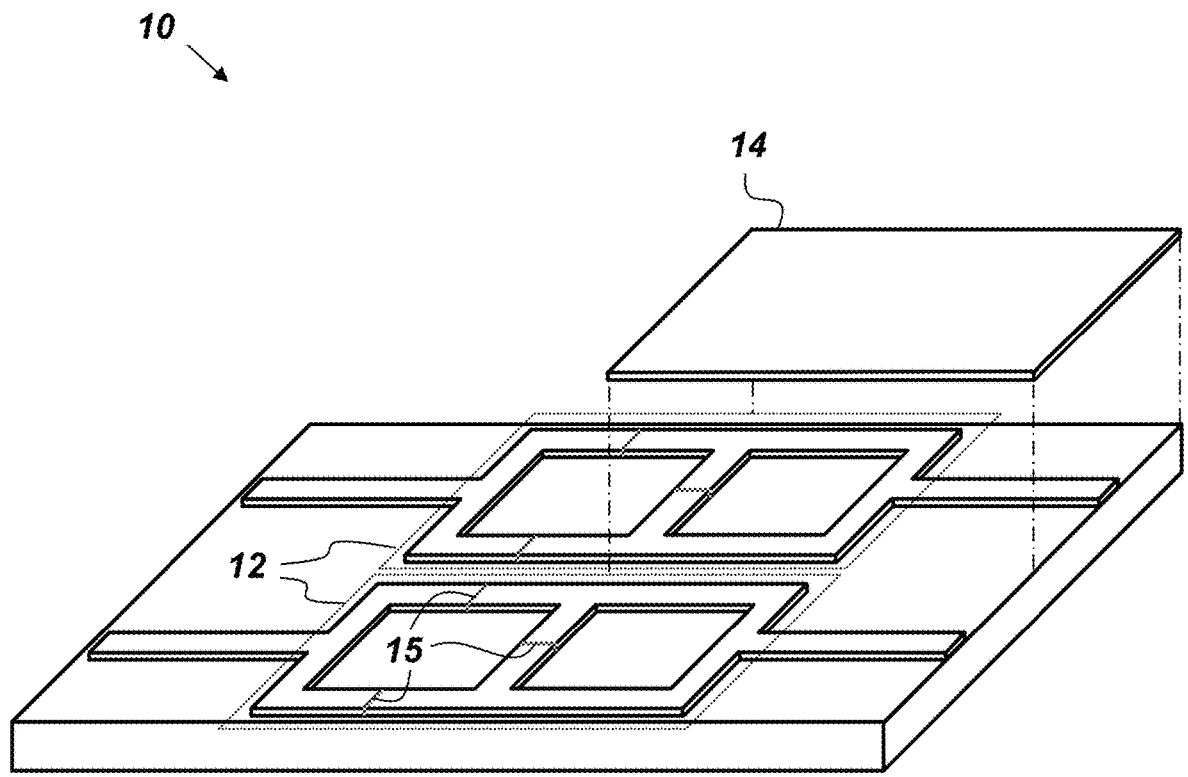
FIG. 1A is an expanded, perspective-view illustration of an example embodiment of a magnetic field detector.

FIG. 1A is an expanded, perspective-view illustration of an example embodiment of a magnetic field detector 10 that comprises, consists of, or consists essentially of: a planar array of superconducting loops 12 and a magnetic shield 14. Each loop 12 constitutes a SQUID, preferably a bi-SQUID. The magnetic shield 14 is disposed over part of one of the loops 12 to protect the covered part of the loop 12 from exposure to a magnetic field. In FIG. 1A, the planar array of superconducting loops 12 is made up of two bi-SQUIDs. It is to be understood that the planar array of superconducting loops 12 is not limited to the planar bi-SQUID array shown in FIG. 1A but may be any desired planar configuration of one or more SQUIDs. The magnetic field detector 10 exhibits a highly linear voltage response in the presence of a changing magnetic field, which is usually not obtainable in HTS devices. The linear behavior may be desired for the production of circuits and devices having very high dynamic range. The bi-SQUID loops 12 shown in FIG. 1A may be fabricated out of any high temperature superconducting material (e.g., Yttrium barium copper oxide (YBCO)), for example, in a single-layer, step-edge process resulting in the formation of HTS Josephson junctions 15. As used herein, the term "high temperature" corresponds to temperatures above 70 K. For example, an embodiment of the magnetic field detector 10 may be made to operate within the temperature range of 70 K to 84 K.

Although some embodiments herein are discussed with reference to YBCO (i.e., YBa2CuOx material, where 6≤x≤7), the embodiments are generally applicable to all known variations of high-temperature superconducting films involving chemical and isotope substitutions for each of the constituent elements. For example, the bi-SQUID loops 12 may be fabricated out of other rare earth elements such as calcium, and the transition metals Ni and Zn.

In a specific, non-limiting example embodiment, the bi-SQUID loops 12 may comprise a high-temperature compound belonging to the class of compounds having a compositional form of R1-yMyBa2Cu3-zTzOx, wherein 6≤x≤7, wherein 0≤y≤1, wherein 0≤z≤1, wherein R comprises at least one of a rare earth and calcium, wherein M comprises at least one of a rare earth distinct from that of R and calcium if absent from R, wherein T comprises at least one of cobalt (Co), iron (Fe), nickel (Ni), and zinc (Zn).

Figure 1B:
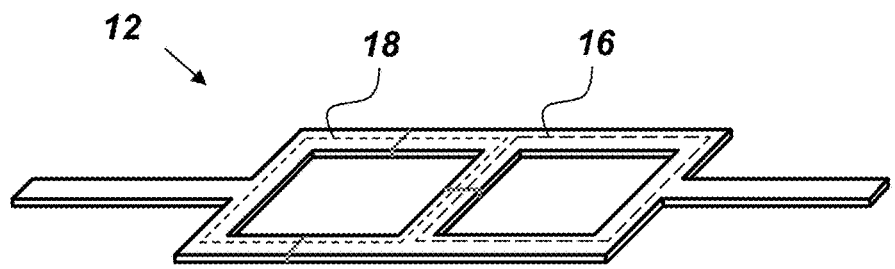
FIG. 1B is a perspective-view illustration of a single bi-SQUID embodiment of a superconducting loop.

FIG. 1B is a perspective-view illustration of a single bi-SQUID embodiment of the loop 12 fabricated through any single-layer process. The loop 12 shown in FIG. 1B is an HTS YBCO bi-SQUID circuit having two sub-loops: an RF sub-loop 16 and a DC sub-loop 18. In low temperature (i.e., having a critical temperature below 30K) bi-SQUIDs, the addition of the third, bisecting Josephson junction leads to an increase in linearity. For bi-SQUIDs manufactured in a single-layer process out of HTS material, without the magnetic shield 14, both the RF sub-loop 16 and the DC sub-loop 18 would pick up the magnetic field, which would negate the bi-SQUID's increased linearity that would be have gained by including the bisecting third Josephson junction as observed in low temperature bi-SQUIDS. The magnetic field detector 10 overcomes this problem, in part, through the addition of the magnetic shield 14, which also reduces hysteresis in the voltage field curve which increases the magnetic field detector 10's suitability for desired applications. In one example embodiment, the magnetic shield 14 is aligned with the loop 12 to shield only the interior of one of the sub-loops. In another example embodiment, the magnetic shield 14 is aligned to cover the interior of the sub-loop and a portion of the bisecting superconducting loop path, including a portion of the third Josephson junction In another example embodiment, the magnetic shield 14 is aligned to cover the interior of one of the sub-loops and the entire bisecting superconducting loop path, including all of the third Josephson junction.

Figure 2A:
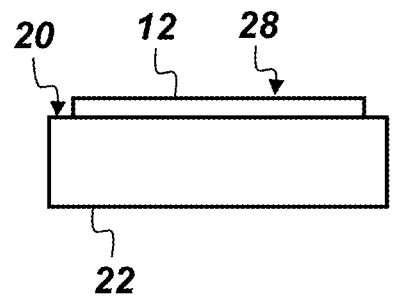
FIG. 2A is a side-view illustration showing a bi-SQUID loop fabricated on a top surface of a substrate.
Figure 2B:
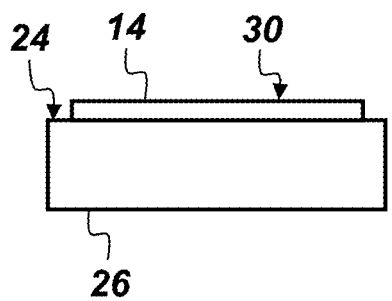
FIG. 2B is a side-view illustration showing a magnetic shield disposed on a top surface of a second substrate.
Figure 2C:
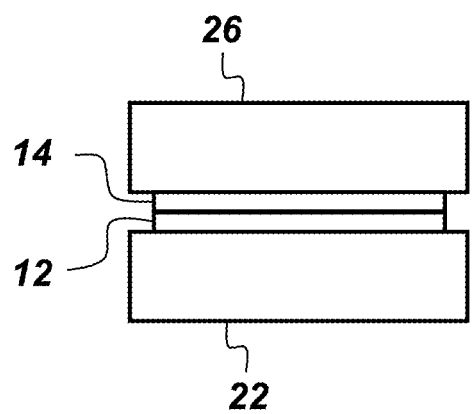
FIG. 2C is a side-view illustration showing first and second substrates in a flip-chip configuration.

FIGS. 2A-2C are illustrations showing the assembly of an embodiment of the magnetic field detector 10 in a flip-chip configuration, which is a way to position the magnetic shield 14 such that it covers one of the sub-loops without destroying the loop 12. FIG. 2A is a side-view illustration showing the bi-SQUID loop 12 fabricated on a top surface 20 of a first substrate 22. FIG. 2B is a side-view illustration showing the magnetic shield 14 disposed on a top surface 24 of a second substrate 26. FIG. 2C is a side-view illustration showing the first and second substrates 22 and 26 disposed with respect to each other such that a top coating 28 of the first substrate 22 is in contact with a top coating 30 of the second substrate 26. The top coatings 28 and 30 may be an insulating layer of material deposited on top of the loop 12 and the magnetic shield 14 such that when in the flip-chip configuration, the magnetic shield 14 does not short the loop 12 when the top coatings 28 and 30 are in contact. A suitable example of the top coatings 28 and 30 includes, but is not limited to, a polymer (photoresist, etc.) that serves to protect whatever it coats from moisture and to serve as a resistive barrier. The top coatings 28 and 30 may be an adhesive underfill disposed between the first and second substrates 22 and 26 as those substrates are placed together. Suitable examples of materials from which the first and second substrates 22 and 26 may be made include, but are not limited to, one of: aluminum oxide ($Al_2O_3$), magnesium oxide (MgO), magnesium aluminate (MgAl2O4), zinc oxide (ZnO), strontium titanate (SrTiO3), lanthanum aluminate (LaAlO3), lithium niobate (LiNbO3), neodynium gallate (NdGaO3), strontium lanthanum aluminate (SrLaAlO3), strontium lanthanum gallate (SrLaGaO3), ytterbium aluminate (YtAlO3), and yttria-(Y2O3)-stabilized zirconia (ZrO2) (YSZ), or any combination thereof or of similar materials.

Figure 3E:
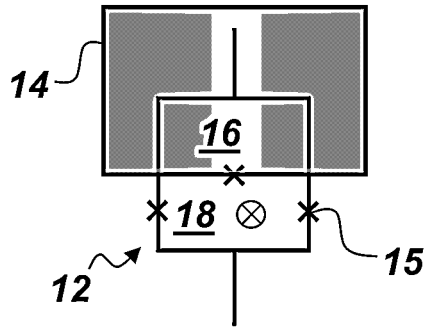
Figure 3E:
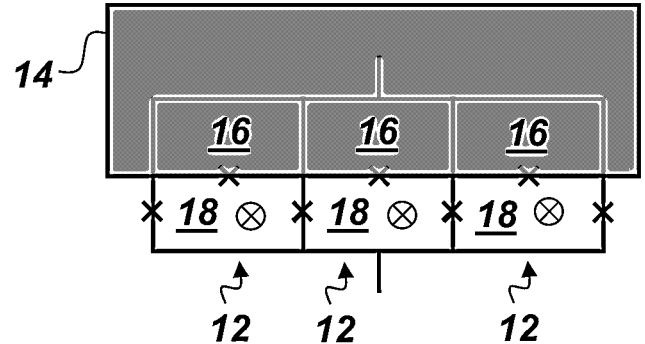
Figure 3E:
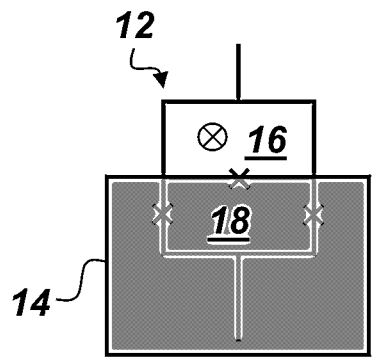
Figure 3E:
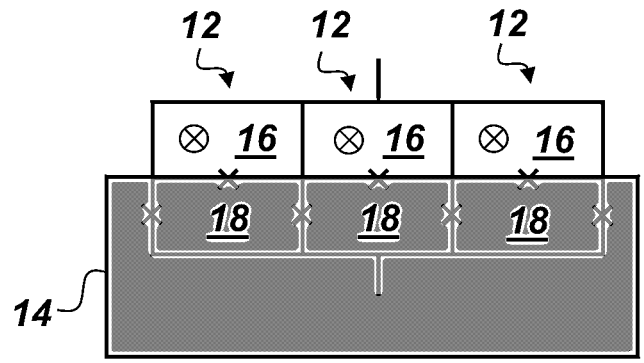
Figure 3E:
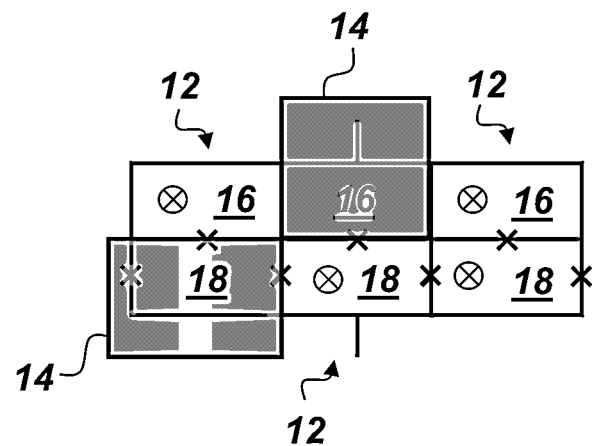

FIGS. 3A-3E are top-view illustrations of different embodiments of the magnetic field detector 10. In FIGS. 3A-3E, the magnetic shield 14 is shown as translucent to facilitate viewing of underlying components, and Josephson junctions 15 are depicted by "X"s. The "X" that is circumscribed by a circle in FIGS. 3A-3E, represents the direction of the magnetic field (i.e., going into the page) through the unshielded sub-loops. In FIG. 3A, the RF sub-loop 16 is shielded by the magnetic shield 14 and the DC sub-loop 18 is unshielded such that it is disposed to pick up the magnetic field. FIG. 3B shows an array of loops 12 where each RF sub-loop 16 in the array is shielded by the magnetic shield 14 and each DC sub-loop 18 in the array is unshielded. In FIG. 3C, the DC sub-loop 18 is shielded by the magnetic shield 14 and the RF sub-loop 16 is not shielded by the magnetic shield 14. FIG. 3D shows a parallel array of three bi-SQUID loops 12 where each DC sub-loop 18 in the array is shielded by the magnetic shield 14 and each RF sub-loop 16 in the array is configured to pick up the magnetic field. In the embodiments of the magnetic field detector 10 shown in FIGS. 3A-3E, an edge of the magnetic shield 14 aligns with the bisecting, superconducting path of each loop 12.

FIG. 3E is an illustration of an example embodiment of the magnetic field detector 10 that includes an array of bi-SQUID loops 12 where one of the bi-SQUID loops 12 in the array has its corresponding RF sub-loop 16 shielded by the magnetic shield 14, another bi-SQUID loop 12 in the array has its corresponding DC sub-loop 18 shielded, and one of the bi-SQUID loops 12 is unshielded. Different embodiments of the magnetic field detector 10 may include an array of any desired number of bi-SQUID loops 12 arranged in parallel or in series, where any desired combination of constituent DC sub-loops 18 and RF sub-loops 16 is shielded by the magnetic shield 14.

Figure 4A:
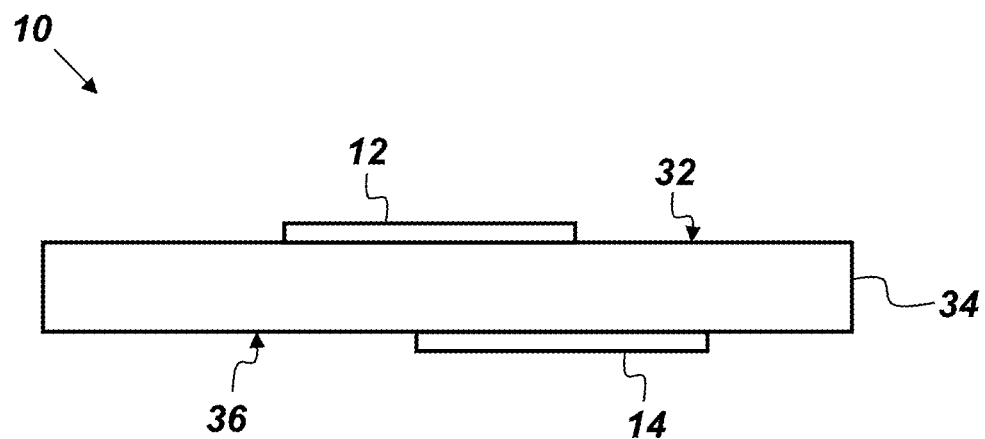
FIG. 4A is a side-view illustration of an embodiment of a magnetic field detector.

FIG. 4A is a side-view illustration of an embodiment of the magnetic field detector 10 where the bi-SQUID loop 12 is fabricated on a top surface 32 of a substrate 34 and the magnetic shield 14 is manufactured on a bottom surface 36 of the substrate 34. In this embodiment, the substrate 34 should be thick enough such that the manufacturing process of the magnetic shield 14 on the bottom surface 36 does not damage the bi-SQUID loop 12 on the opposing side (i.e., the top surface 32). The magnetic field from which the magnetic shield 14 protects the covered sub-loop can be an ambient magnetic field or an applied magnetic field.

Figure 4B:
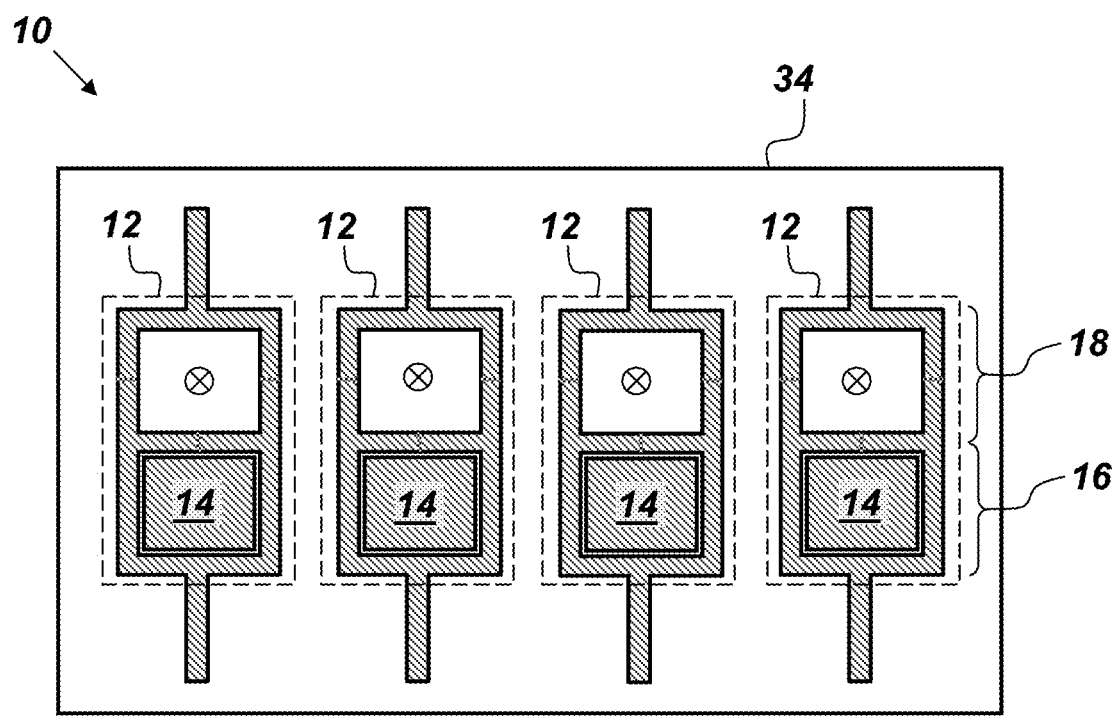
FIG. 4B is a top-view illustration of an embodiment of a magnetic field detector.

FIG. 4B is a top-view illustration of an embodiment of the magnetic field detector 10 that comprises an array of four bi-SQUID loops 12. In the embodiment shown in FIG. 4B, each of the RF sub-loops 16 is partially filled with superconducting material that functions to substantially block passage of the magnetic field through the RF sub-loops 16 such that the partially-filled sections of the RF sub-loops 16 serve as the magnetic shield 14. With respect to this embodiment where one of the sub-loops is partially filled with superconductive material, the superconductive material within the sub-loop can be separated from the superconductive material of the sub-loop itself by insulating material or a void in the superconducting material that separates the magnetic shield 14 and the sub-loop. The partial filling may be applied to either the DC sub-loop or the RF sub-loop or a combination of both. The partial filling of a sub-loop effectively reduces the inductance of the partially-filled sub-loop. This may not be as effective as flip-chip shielding as shown in FIG. 2C, but may provide sufficient improvement in linearity and bi-SQUID behavior over unshielded counterparts.

Figure 5:
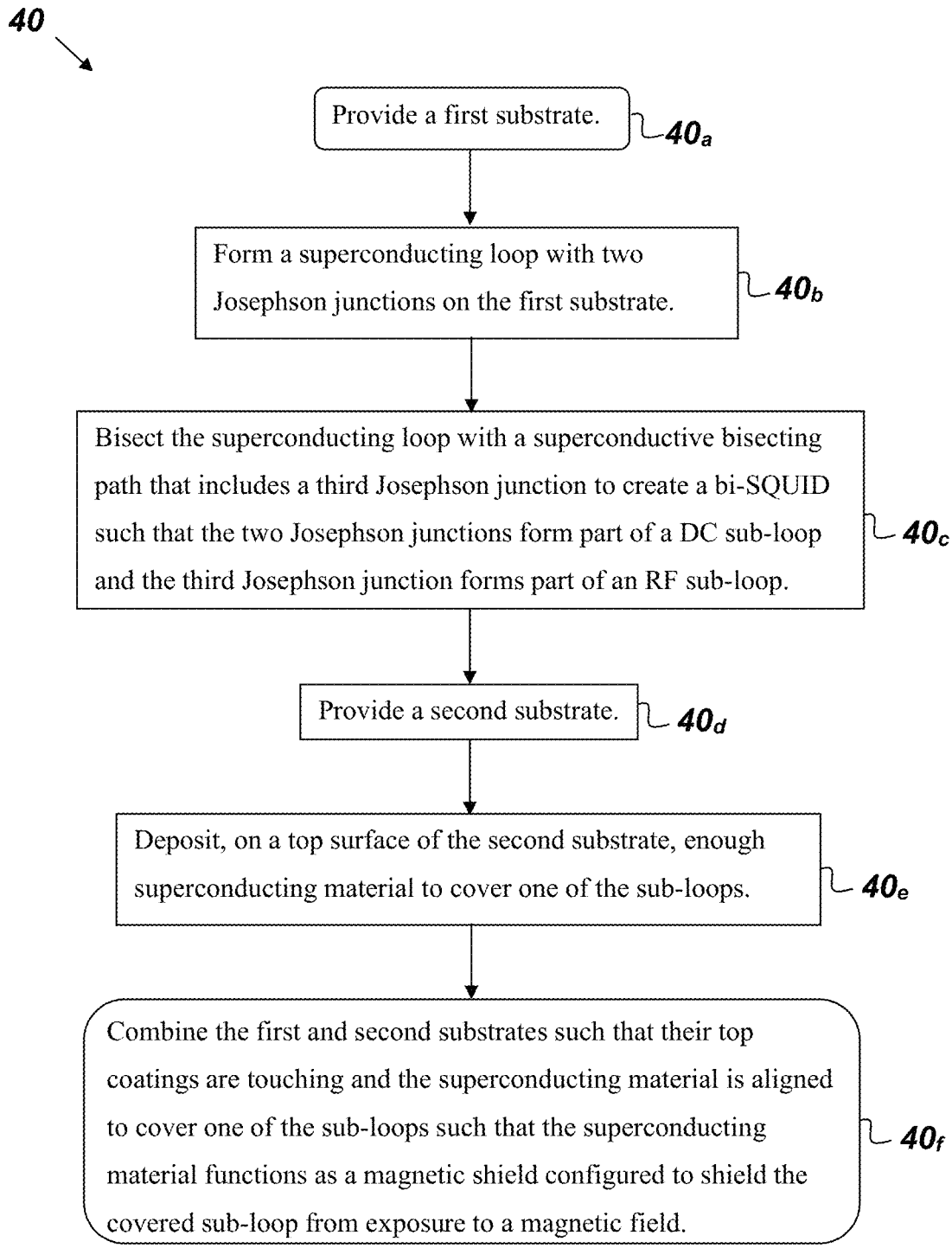
FIG. 5 is a flowchart of a method for fabricating a magnetic field detector.

FIG. 5 is a flowchart of a method 40 for manufacturing a high-temperature superconducting bi-SQUID that comprises, consists of, or consists essentially of the following steps. The first step 40a involves providing a first substrate. The next step 40b provides for forming a superconducting loop with two Josephson junctions on the first substrate. The next step 40c provides for bisecting the superconducting loop with a superconductive bisecting path that includes a third Josephson junction to create a bi-SQUID. The two Josephson junctions form part of a DC sub-loop and the third Josephson junction forms part of an RF sub-loop. The next step 40d involves providing a second substrate. The next step 40e provides for depositing, on a top surface of the second substrate, enough superconducting material to cover one of the sub-loops. The next step 40f provides for combining the first and second substrates such that their top coatings are touching and the superconducting material is aligned to cover one of the sub-loops such that the superconducting material functions as a magnetic shield configured to shield the covered sub-loop from exposure to a magnetic field.

The magnetic shield 14 may be used to prevent a biasing magnetic field from entering a given sub-loop of the bi-SQUID loop 12. Embodiments of the magnetic shield 14 made of superconducting material will shield both magnetic and electromagnetic fields. A metallic film may also be used as the magnetic shield 14. Step-edge bi-SQUID embodiments of the magnetic field detector 10, such as some of the embodiments discussed above allow for HTS operation and a reduced SWaP, when compared to LTS variants. It is to be understood that the magnetic field detector 10 does not need to be made with the step edge process, but any single layer process is acceptable. A preferred target temperature of operation is 77K, which is the temperature of liquid nitrogen. The magnetic field detector 10 may be designed to operate at a given temperature, and to perform within +/−2-3 K of the given temperature. The shielding provided by the magnetic shield 14 will work best the flatter the circuit is, and the step edge does have (only ~400 micron) some depth that would prevent a tight shield "flip chip" interface.

The magnetic field detector 10 may be used as a building block to fabricate two-dimensional arrays of bi-SQUIDs loops 12 where the magnetic shield 14 comprises a strip of shielding material disposed over half of the bi-SQUID loops 12. The arrays could contain both unshielded SQUIDs and shielded bi-SQUIDs. The rows in a two-dimensional array could have various configurations wherein different RF sub-loops and DC sub-loops of the bi-SQUID loops 12 are shielded within the same array.

From the above description of the magnetic field detector 10, it is manifest that various techniques may be used for implementing the concepts of the magnetic field detector 10 without departing from the scope of the claims. The described embodiments are to be considered in all respects as illustrative and not restrictive. The method/apparatus disclosed herein may be practiced in the absence of any element that is not specifically claimed and/or disclosed herein. It should also be understood that the magnetic field detector 10 is not limited to the particular embodiments described herein, but is capable of many embodiments without departing from the scope of the claims.

We claim:

1. A superconducting quantum interference apparatus comprising:
   a planar array of loops, each loop constituting a superconducting quantum interference device, and
   a magnetic shield disposed over only half of the loops so as to protect the half of the loops from exposure to a magnetic field.

2. The superconducting quantum interference apparatus of claim 1, wherein the planar array of loops is any planar bi-SQUID array design.

3. A magnetic field detector comprising:
   a bi-superconducting quantum interference device (bi-SQUID) comprising two Josephson junctions in a superconducting loop and a third Josephson junction in a superconducting path that bisects the superconducting loop, wherein the two Josephson junctions are part of a direct current (DC) sub-loop and the third Josephson junction is a component of a radio frequency (RF) sub-loop, and wherein the bi-SQUID is fabricated in a single-layer process such that the bi-SQUID is able to operate at temperatures above 70 K; and
   a magnetic shield disposed over one of the sub-loops such that only the sub-loop that is not covered by the magnetic shield is exposed to a magnetic field.

4. The magnetic field detector of claim 3, wherein the bi-SQUID is fabricated on a top surface of a first substrate and the magnetic shield is manufactured on a top surface of a second substrate, and wherein the first and second substrates are disposed with each other such that a top coating of the first substrate is in contact with a top coating of the second substrate.

5. The magnetic field detector of claim 4, further comprising an adhesive underfill between the first and second substrates.

6. The magnetic field detector of claim 3, wherein the bi-SQUID is fabricated on a top surface of a substrate and the magnetic shield is manufactured on a bottom surface of the substrate.

7. The magnetic field detector of claim 3, wherein magnetic field is an ambient magnetic field.

8. The magnetic field detector of claim 3, wherein the RF sub-loop is shielded by the magnetic shield.

9. The magnetic field detector of claim 3, wherein the DC sub-loop is shielded by the magnetic shield.

10. The magnetic field detector of claim 3, further comprising an array of bi-SQUIDs, wherein the RF sub-loop of each bi-SQUID in the array is shielded by the magnetic shield.

11. The magnetic field detector of claim 3, further comprising an array of bi-SQUIDs, wherein some of the bi-SQUIDs in the array have their corresponding RF sub-loops shielded by the magnetic shield and the other bi-SQUIDs in the array are unshielded.

12. The magnetic field detector of claim 3, wherein an edge of the magnetic shield aligns with the bisecting, superconducting path.

13. The magnetic field detector of claim 3, wherein more than half of an area surrounded by the RF sub-loop is filled with superconducting material that is separated from the RF sub-loop by insulating material or void in the superconducting material.

14. The magnetic field detector of claim 3, further comprising an array of bi-SQUIDs, wherein the array includes a combination of a) RF sub-loops and DC sub-loops that are shielded by the magnetic shield and b) RF sub-loops and DC sub-loops that are not shielded by the magnetic shield.

15. A high-temperature superconducting bi-SQUID comprising:
   a first substrate having a top surface;
   a superconducting loop with two Josephson Junctions disposed on the top surface of the first substrate, wherein the superconducting loop is bisected with a superconductive bisecting path that includes a third Josephson junction to create a bi-SQUID, wherein the two Josephson junctions form part of a direct current (DC) sub-loop and the third Josephson junction forms part of a radio frequency (RF) sub-loop;
   a second substrate having a top surface coated with superconducting material, wherein the top surface of the second substrate and the top surface of the first substrate are in contact with each other and aligned such that the superconducting material on the second substrate covers one of the sub-loops such that the superconducting material functions as a magnetic shield configured to shield the covered sub-loop from exposure to a magnetic field.

16. The high-temperature superconducting bi-SQUID claim 15, wherein the RF sub-loop is the sub-loop shielded by the magnetic shield.

17. The high-temperature superconducting bi-SQUID of claim 15, wherein the DC sub-loop is the sub-loop shielded by the magnetic shield.

18. The high-temperature superconducting bi-SQUID claim 15, further comprising an array of bi-SQUIDs disposed on the first substrate, wherein the magnetic shield is positioned such that the RF sub-loop of each bi-SQUID in the array is shielded by the magnetic shield.

19. The high-temperature superconducting bi-SQUID claim 15, further comprising an array of bi-SQUIDs formed on the first substrate, wherein the magnetic shield is disposed such that the DC sub-loop of each bi-SQUID in the array is shielded by the magnetic shield.

20. The high-temperature superconducting bi-SQUID claim 15, wherein more than half of an area surrounded by the RF sub-loop is filled with superconducting material that is separated from the RF sub-loop by insulating material or a void in the superconducting material.

* * * * *